United States Patent
Mugiraneza et al.

(10) Patent No.: US 11,527,584 B2
(45) Date of Patent: Dec. 13, 2022

(54) TOUCH PANEL INTEGRATING BENDING SENSOR FOR FOLDABLE OLED DISPLAY

(71) Applicant: SHARP KABUSHIKI KAISHA, Sakai (JP)

(72) Inventors: Jean Mugiraneza, Sakai (JP); Andrew Kay, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 58 days.

(21) Appl. No.: 17/077,173

(22) Filed: Oct. 22, 2020

(65) Prior Publication Data

US 2022/0130910 A1 Apr. 28, 2022

(51) Int. Cl.
*H01L 27/32* (2006.01)
*G06F 3/041* (2006.01)
*G06F 3/044* (2006.01)
*H01L 51/52* (2006.01)

(52) U.S. Cl.
CPC .......... *H01L 27/323* (2013.01); *G06F 3/0412* (2013.01); *G06F 3/0445* (2019.05); *H01L 51/5237* (2013.01); *G06F 2203/04102* (2013.01); *G06F 2203/04107* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 2011/0096025 A1* | 4/2011 | Slobodin | ............... | G06F 3/0445 345/174 |
| 2014/0139447 A1* | 5/2014 | Kang | ................... | G06F 3/04164 345/173 |
| 2015/0241924 A1* | 8/2015 | Chang | ................... | G06F 1/1652 349/12 |
| 2018/0069053 A1* | 3/2018 | Bok | ...................... | H01L 51/5271 |
| 2018/0088633 A1* | 3/2018 | Whitman | ............... | G06F 1/1677 |
| 2018/0120615 A1* | 5/2018 | Wang | ..................... | G06F 3/0443 |
| 2019/0064958 A1* | 2/2019 | Liu | ........................ | G06F 3/0412 |

* cited by examiner

*Primary Examiner* — Amare Mengistu
*Assistant Examiner* — Sarvesh J Nadkarni
(74) *Attorney, Agent, or Firm* — ScienBiziP, P.C.

(57) ABSTRACT

A flexible touch panel apparatus includes a series of first electrodes extending along a first direction, at least one second electrode extending along a second direction and defining a bending axis of the flexible touch panel. An elastomeric layer is located between the series of first electrodes at least second electrode. A series of third electrodes are extending along the second direction parallel to the bending axis, and an insulator layer is located between at least one second electrode and the series of third electrodes. At least one second electrode is capacitively coupled to at least one of the series of first electrodes for bend sensing in the flexible touch panel along the bending axis, and the third electrodes are capacitively coupled to the first electrodes for touch sensing on the flexible touch panel.

19 Claims, 8 Drawing Sheets

TOUCH PANEL INTEGRATING BENDING SENSOR FOR FOLDABLE OLED DISPLAY

FIELD

The present disclosure generally relates to bendable and foldable displays, and more particularly, to a touch and bend sensing touch panel for a foldable display constituting a bend sensing capability for altering the display layout and functions.

BACKGROUND

User interactions through traditional keyboard, mouse, and joystick with physical buttons and levers in various implementations have been replaced by sensors integrated in multi-touch sensor panels and configured by software to be shown and sensed on an interactive display panel, such as an OLED, QLED, etc. Touch panels are integrated into display panels for ease of control and to display content simultaneously with such control, for example, on smartphones, tablet computers, notebook and laptop PCs, game consoles, and in various industrial and automotive controls.

In recent years, display sensors that can detect both static and dynamic forces on a touch panel have received increasing attention, since these features replace traditional physical hardware, such as a mouse and keyboard. Additionally, OLED displays that are malleable (i.e., bendable and foldable) have become available, allowing a display to bend and fold from one physical configuration to another. For example, by mounting a bendable OLED display in a foldable housing, a device and its display may fold to mimic a laptop type computer configuration, and unfold to mimic a tablet type computer configuration. Other configurations are also possible.

Having a display switchable between, for example, a folded and flat configuration presents challenges. For example, in a flat configuration, user may want to engage an entire display, and the display may entirely rely on interactive graphics and icons, without the need for entering text. In a folded configuration, a user may want to engage the display in a manner similar to a laptop computer, where one portion of the display becomes a virtual screen, and another portion of the display becomes a virtual keyboard for entering text. In such a situation, it is important that devices are able to automatically detect these configurations (i.e., flat or folded) and adjust their displays accordingly.

Thus, there is a need for a bendable and/or foldable display apparatus enabling an OLED or similar type of display to automatically switch between a flat configuration display and a folded configuration display. There is also a need for the display apparatus with touch functionality that is also able to determine the difference between a touch panel input action and a bending and/or folding action.

SUMMARY

A flexible touch panel apparatus with bend sensing capability includes a plurality of first electrodes extending along a first direction, and at least one second electrode extending along a second direction. The second electrode (i.e., one or more second electrodes) defines a bending axis of the flexible touch panel. An elastomeric layer is disposed between the plurality of first electrodes and the second electrode, and a plurality of third electrodes extending along the second direction parallel to the bending axis. An insulator layer is disposed between the at least one second electrode and the plurality of third electrodes.

The at least one second electrode is capacitively coupled to at least one of the plurality of first electrodes for bend sensing in the flexible touch panel along the bending axis. Additionally, the plurality of third electrodes are capacitively coupled to the plurality of first electrodes for touch sensing on the flexible touch panel.

Preferably, the second electrode is (or second electrodes are) capacitively coupled to at least one of the plurality of first electrodes in order to allow force sensing on the flexible touch panel. Additionally, the bend along the bending axis results in a change in a thickness of the elastomeric layer between the at least one second electrode and at least one of the plurality of first electrodes, thereby changing a capacitance between the at least one second electrode and at least one of the plurality of first electrodes. To facilitate bend sensing, the elastomeric layer preferably has a modulus of elasticity below 1 MPa.

In a preferred implementation, at least one of the plurality of third electrodes overlaps the second electrode (or electrodes) in a third direction thereby shielding the second electrode (or electrodes) from interference by user capacitive touch effects. Preferably, the third direction is perpendicular to the first direction and the second direction. To isolate touch effects from bending effects, the insulator layer preferably has a modulus of elasticity greater than that of the elastomeric layer.

In various implementations, the first direction may be perpendicular to the second direction, and the plurality of third electrodes includes feather touch sensing electrodes. The plurality of first electrodes are configured to transmit at least one sensing signal, the second electrode is (or second electrodes are) configured to receive one or more sensing signals, and the plurality of third electrodes is configured to receive one or more sensing signals. In various implementations of the present disclosure, a feather touch may refer to a conventional projected capacitance touch (e.g. touch without necessarily detecting any force, just the capacitance change as between the first and third electrodes when a finger is present).

In one implementation, the second electrode (or electrodes) may be disposed proximal an edge of the touch panel. Additionally, the plurality of first electrodes may comprise a transmit electrode for touch, and a special transmit electrode for bend sensing. In such an instance, the transmit electrode for touch, and the special transmit electrode for bend sensing may be disposed in a common layer of the flexible touch panel.

In other implementations, the plurality of first electrodes, the second electrode (or electrodes), and the plurality of third electrodes are disposed between a polarizer and an OLED display. In such an implementation, the OLED display may include a thin film encapsulation layer. An OLED display may be disposed between the plurality of third electrodes and the plurality of first electrodes. An OLED display may also be disposed between the plurality of third electrodes and the at least one second electrode. In such an implementation, a thin film encapsulation layer between the OLED and the plurality of third electrodes. Additionally, the plurality of first electrodes comprise a transmitting layer deposited directly on an OLED display thin film encapsulating layer.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

DETAILED DESCRIPTION

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series and the equivalent. The expression "at least one of A, B and C" or "at least one of the following: A, B and C" means "only A, or only B, or only C, or any combination of A, B and C."

Additionally, for purposes of explanation and non-limitation, specific details, such as functional entities, techniques, protocols, standards, and the like are set forth for providing an understanding of the described technology. In other examples, detailed description of well-known methods, technologies, system, architectures, and the like are omitted so as not to obscure the description with unnecessary details.

Figure 1:
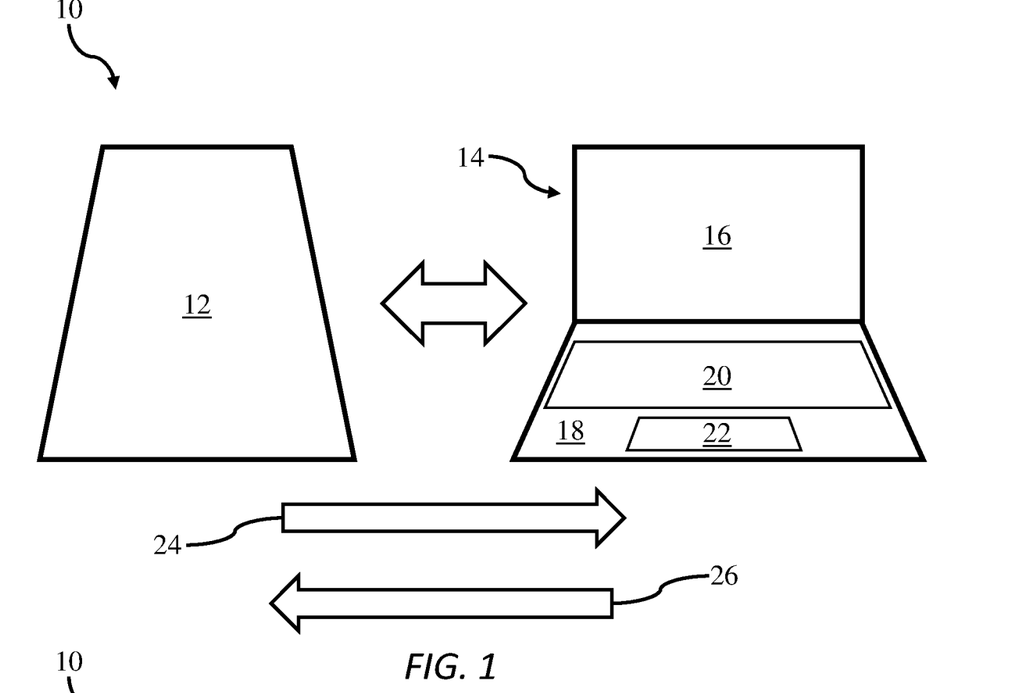
FIG. 1 illustrates a touch-bend sensing panel oriented in both a planar configuration and a folded configuration.

Referring to FIG. 1, one implementation of a touch-bend sensing panel 10 incorporated into, for example, an OLED display, comprises a touch-bend sensing panel 10 having touch panel functionality along with integrated bend sensing (i.e., a 'touch-bend' sensing panel). The touch-bend sensing panel 10 is shown in both a flattened configuration 12 and a folded configuration 14. In the flattened configuration 12, the touch-bend sensing panel 10 preferably includes touch screen functionality uniformly across the touch-bend sensing panel 10 in the manner of a conventional flat panel touch screen (e.g., a hand-held tablet computing device, etc.) In the folded configuration 14, folding and/or bending of the touch-bend sensing panel 10 has been sensed, and portions of the touch-bend sensing panel 10 have been divided into a display portion 16 for displaying information, and an input portion 18, that allows users to input information on the input portion 18 using the touch sensing capabilities of the touch-bend sensing panel 10.

In the exemplary illustrated implementation, upon folding, the touch-bend sensing panel 10 has been configured to resemble portions of a conventional laptop computer, including a display portion 16 configured to represent a screen for displaying information, and an input portion 18 comprising a keyboard area 20 and a track pad ('mouse') 22 area configured for receiving information input by a user. First arrow 24 represents the transition of the touch-bend sensing panel 10 from the flattened configuration 12 to the folded configuration 14, whereupon the touch-bend sensing panel 10 switches functions to the folded configuration 14. Second arrow 26 represents the transition of the touch-bend sensing panel 10 from the folded configuration 14 to the flattened configuration 12, whereupon the touch-bend sensing panel 10 switches functions back to the flattened configuration 12.

Figure 2:
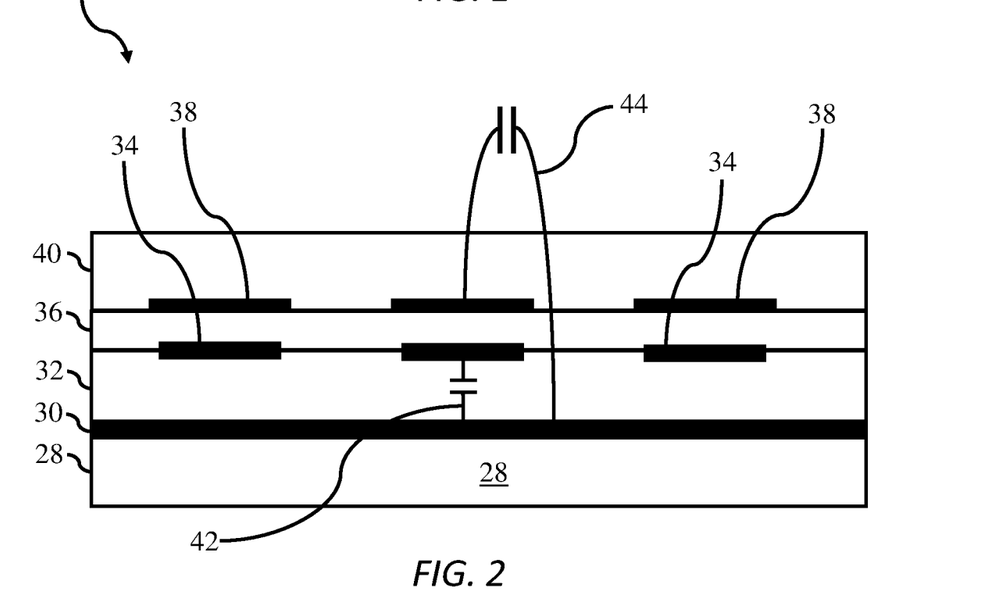
FIG. 2 illustrate a section elevation of the touch-bend sensing panel in a planar configuration.

FIG. 2 illustrates a section elevation view of at least a portion of the touch-bend sensing panel 10 in the flattened configuration 12 shown in FIG. 1. The touch-bend sensing panel 10 comprises a bottom substrate layer 28 upon which additional layers are deposited. A series of first electrodes 30, configured as transmit electrodes for transmitting a sensing signal, has been deposited across the bottom substrate layer 28, preferably in an array extending across the touch-bend sensing panel 10 in a first direction. This illustrated view shows a cross section of one of the first electrodes 30 in the array. An elastomeric layer 32 has been deposited over the array of first electrodes 30.

A series of second electrodes 34 have been deposited over the elastomeric layer 32, preferably in an array extending across the touch-bend sensing panel 10 in a second direction, orthogonal and/or perpendicular to the first direction. An insulator layer 36 has been deposited over the second electrodes 34 and the elastomeric layer 32. A series of third electrodes 38 have been deposited over the insulator layer 36, preferably in an array extending across the touch-bend sensing panel 10 in the second direction and over the second electrodes 34, and a top substrate layer 40 has been deposited over the third electrodes 38 and the insulator layer 36.

The second electrodes 34 are configured as bend sensing electrodes for sensing a bend signal from the first electrodes 30, and the third electrodes 38 are configured as touch sensing electrodes for sensing a touch signal from the first electrodes 30. Since the second electrodes 34 and the third electrodes 38 expand in a direction orthogonal and/or perpendicular to the first electrodes 30, touch and bending can be detected at any point on the touch-bend sensing panel 10, depending on the address of a first electrode 30, and the addresses of corresponding second electrodes 34 and third electrodes 38. The second electrodes 34 are capacitively coupled to the first electrodes 30 through a first capacitance 42, and the third electrodes 38 are capacitively coupled to the first electrode 30 through a second capacitance 44, enabling them to sense a change in mutual capacitance coupling to the first electrode 30.

Figure 3:
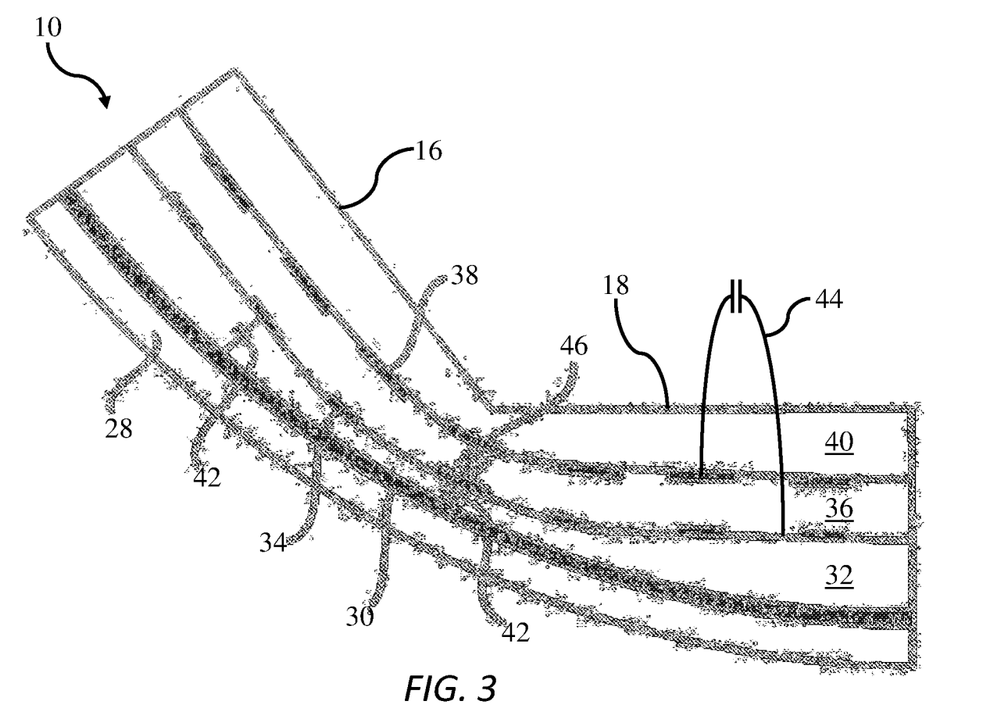
FIG. 3 illustrates a section elevation view of the touch-bend sensing panel in a folded configuration.

Referring to FIG. 3, a section elevation view of at least a portion of the touch-bend sensing panel 10 in the folded configuration 14 of FIG. 1 is shown. In the folded configuration 14, the touch-bend sensing panel 10 is bent along a bending axis 46 causing a creasing effect along the bending axis 46. The elastomeric layer 32 has a low modulus of elasticity, preferably below one MPa, such that bending (and the concomitant creasing action) of the touch-bend sensing panel 10 causes deformation of the elastomeric layer 32 along the bending axis 46. Because the bottom substrate layer 28, insulator layer 36, and top substrate layer 40 each have a greater modulus of elasticity than the elastomeric layer 32, the thickness of the elastomeric layer 32 is reduced upon bending. With a reduction thickness of the elastomeric layer 32, the second electrodes 34 and the first electrodes 30 along the bending axis 46 are brought closer together, and thus the first capacitance 42 between the second electrodes 34 and the first electrodes 30 along the bending axis 46 is detectably altered.

As shown in FIGS. 2 and 3, the third electrodes 38 are patterned in such a way as to overlap and shield the second electrodes 34 from capacitive interference. The shielding effect prevents the second electrodes 34 from interference from capacitive touch effects when a user engages the third electrodes 38, ensuring that the second electrodes 34 respond only to bending, and preventing the touch-bend sensing panel 10 from inadvertently interpreting a touch input as a folding action.

Figure 4:
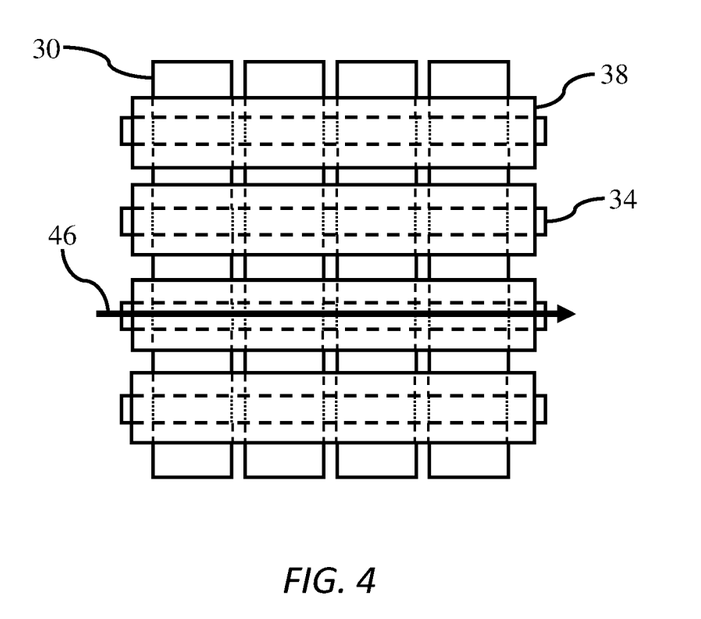
FIG. 4 illustrates a plan view of an arrangement of electrodes in at least a portion of the touch-bend sensing panel.

FIG. 4 illustrates in plan view an exemplary arrangement of first electrodes 30, second electrodes 34 and third electrodes 38 across at least a portion of the touch-bend sensing panel 10. In this exemplary arrangement, an array of first electrodes 30 are oriented vertically in parallel, and the array of first electrodes 30 extends horizontally across the touch-bend sensing panel 10. The second electrodes 34 and third electrodes 38 are oriented horizontally in parallel, with the array of second electrodes 34 and third electrodes 38 extending vertically across the touch-bend sensing panel 10. As shown in the exemplary arrangement, and as discussed above, the third electrodes 38 cover the second electrodes 34, thereby shielding the second electrodes 34 from touch-based capacitive interference. Also shown in this view is the bending axis 46, extending across the array of first electrodes 30 and in parallel with the second electrodes 34 and third electrodes 38 as shown in FIG. 3.

When the first electrodes 30, second electrodes 34 and third electrodes 38 form a grid covering the entire touch area of the touch-bend sensing panel 10 as shown in FIG. 4, it becomes important to distinguish effects from bending the touch-bend sensing panel 10 when switching from the flattened configuration 12 to the folded configuration 14, from the effects from touching (i.e., pressing on) the touch-bend sensing panel 10 for the purposes of inputting information. An algorithm may be used to differentiate between activations caused by the two actions, respectively.

Each type of activation generates non-zero signals on a connected set of electrodes, the extent of which can be analyzed. If a connected set of electrodes is well localized, it is interpreted as a press (i.e., touch) action. If a connected set of electrodes constitutes a line, for example from one edge of the touch-bend sensing panel 10 to the other, and in some implementations in the direction of a possible bend axis, it constitutes a bend action. To calculate the position and degree of bending, the algorithm extracts the centroid of the signal within the connected set, in a direction parallel to the allowed bending axis, in order to provide the likely position of the bend. The total sum of the signal within the connected set estimates the degree of bending, and calibration can be used to convert the sum of the signal to an angle measurement. This allows the touch-bend sensing panel 10 to switch from the flattened configuration 12 to the folded configuration 14 not just upon bending, but upon bending to a specific degree.

Figure 5:
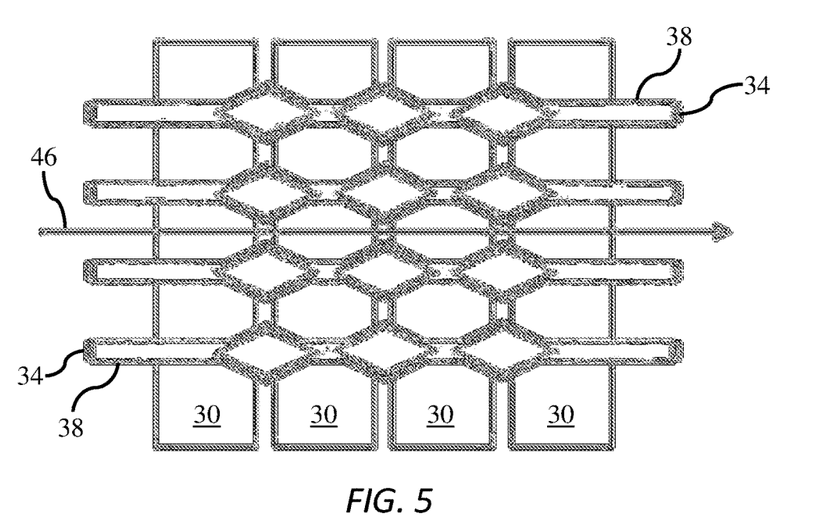
FIG. 5 illustrates a plan view of an alternative arrangement of electrodes in at least a portion of the touch-bend sensing panel.

Referring to FIG. 5 an alternative exemplary arrangement of the first electrodes 30, second electrodes 34 and third electrodes 38 is shown. The alternative exemplary arrangement is similar to the exemplary arrangement of FIG. 4, in that an array of first electrodes 30 are oriented vertically and extend horizontally across the touch-bend sensing panel 10, while an array of second electrodes 34 and an array of third electrodes 38 are arranged horizontally and extend vertically across the touch-bend sensing panel 10. In the alternative exemplary embodiment, the second electrodes 34 and the third electrodes 38 are diamond patterned. By patterning the array of second electrodes 34 and the array of third electrodes 38 in the illustrated manner (or in another pattern configuration according to preference), accuracy in touch sensing and bend sensing may be increased.

Figure 6:
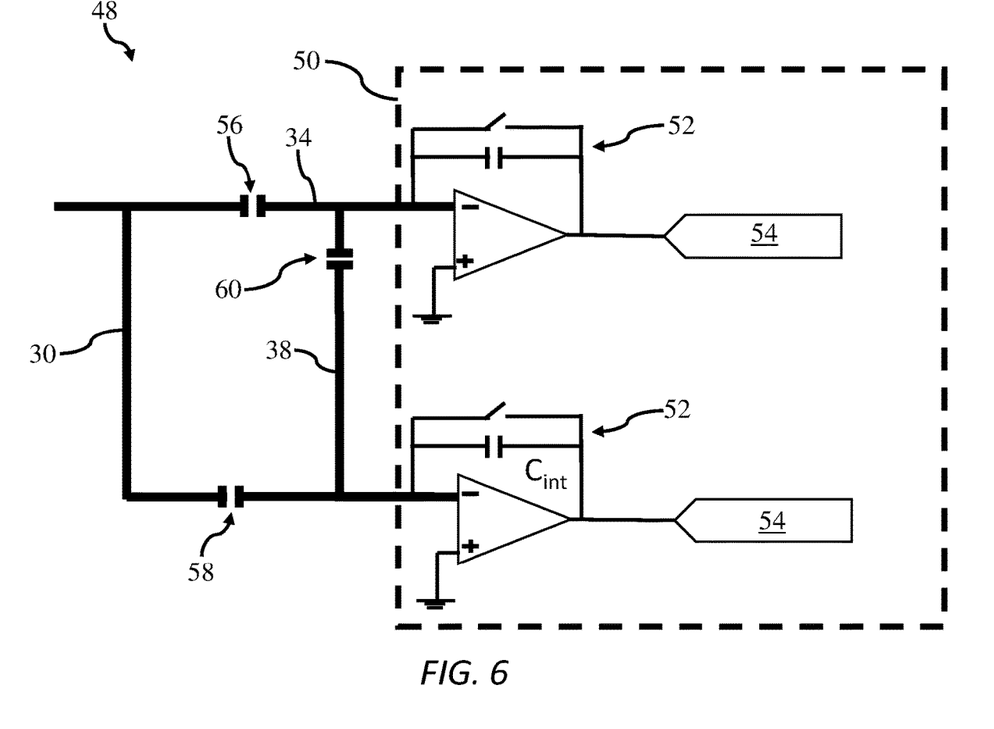
FIG. 6 illustrates a first exemplary circuit illustrating an electrode configuration of the touch-bend sensing panel.

FIG. 6 illustrates a first exemplary circuit arrangement 48 illustrating a configuration of the first electrodes 30, the second electrodes 34 and the third electrodes 38 with respect to a touch integrated circuit 50 of the touch-bend sensing panel 10. The touch integrated circuit 50 includes internal capacitance sensors 52 in communication with analog-to-digital converters 54 for processing a bending signal or a touch signal from the touch-bend sensing panel 10. In the first exemplary circuit arrangement 48, there is a first capacitance 56 between the first electrodes 30 and the second electrodes 34, a second capacitance 58 between the first electrodes 30 and the third electrodes 38, and a third capacitance 60 between the second electrodes 34 and the third electrodes 38. The first capacitance 56 of the elastomeric layer 32 (as shown FIGS. 2 and 3) changes upon bending of the touch-bend sensing panel 10, generating a bending signal, while the second capacitance 58 changes when the touch-bend sensing panel 10 is touched (i.e., pressed) by a user engaging the touch function.

Figure 7:
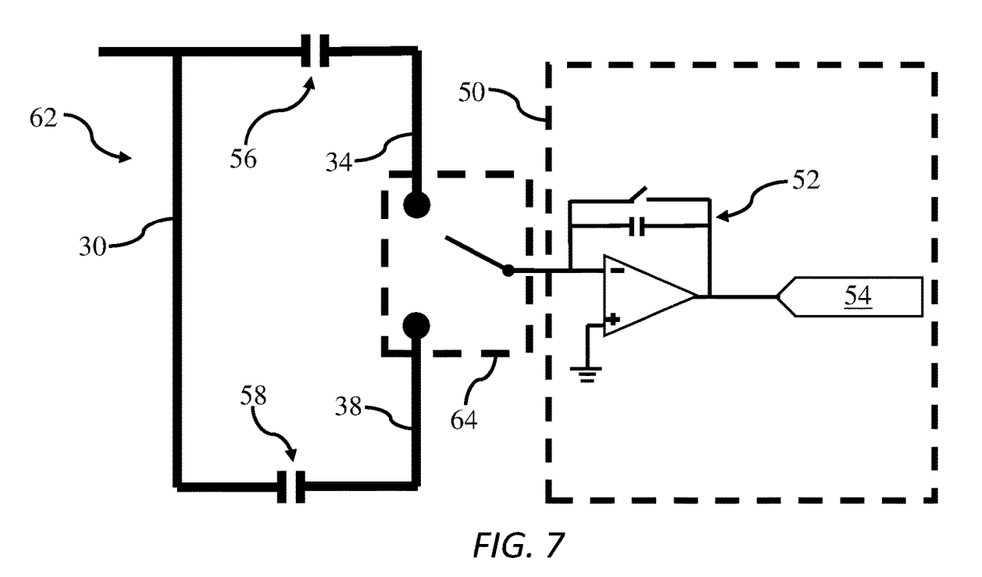
FIG. 7 illustrates a second exemplary circuit illustrating an electrode configuration of the touch-bend sensing panel.

FIG. 7 illustrates a second exemplary circuit arrangement 62 incorporating a switch multiplexer 64 between the touch-bend sensing panel 10 and the touch integrated circuit 50. In the second exemplary circuit arrangement 62, the first electrodes 30 are in communication with the second electrodes 34 through the first capacitance 56, and in communication with the third electrodes 38 through the second capacitance 58. The second electrodes 34 and the third electrodes 38 are connected to the switch multiplexer 64, which is in turn connected to the touch integrated circuit 50, incorporating an internal capacitance sensor 52 and an analog-to-digital converter 54. The switch multiplexer 64 is configured to switch between bend sensing from changes in the first capacitance 56 when the touch-bend sensing panel 10 is bent or folded, and touch sensing from changes in the second capacitance 58 when the touch-bend sensing panel 10 is touched.

Figure 8:
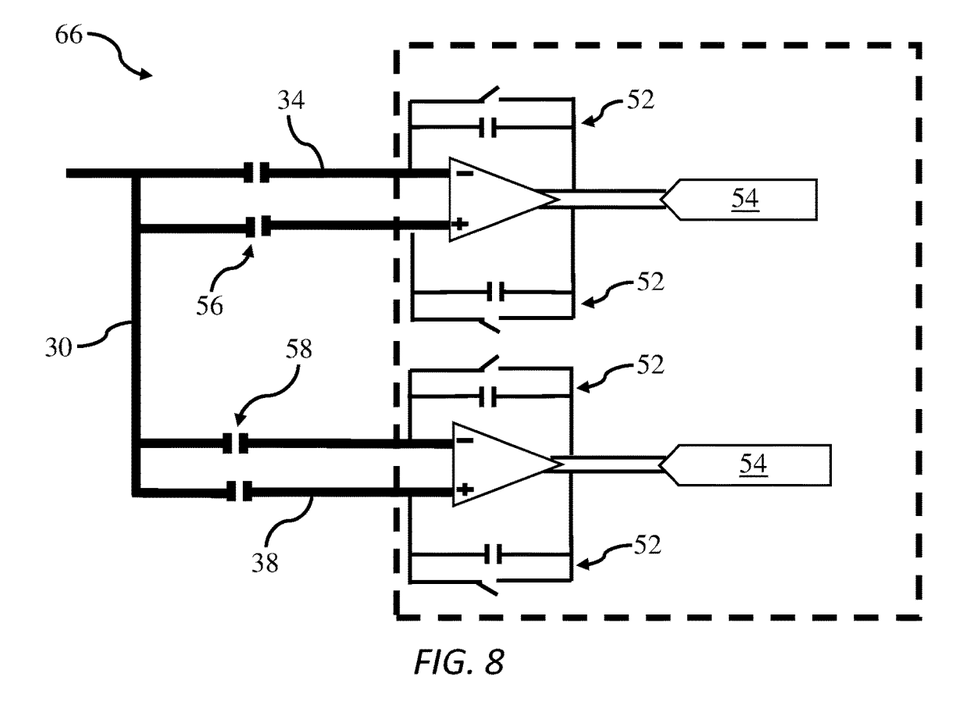
FIG. 8 illustrates a third exemplary circuit illustrating an electrode configuration of the touch-bend sensing panel.

FIG. 8 illustrates a third exemplary circuit arrangement 66 employing differential sensing methods. In the third exemplary circuit arrangement 66, there are two points of the first capacitance 56 between the first electrodes 30 and the second electrodes 34, which lead to separate independent internal capacitance sensors 52, each connected to an analog-to-digital converter 54. Likewise, there are two points of second capacitance 58 between the first electrodes 30 and the third electrodes 38, which lead to separate independent internal capacitance sensors 52, each connected to an analog-to-digital converter 54.

Figure 9:
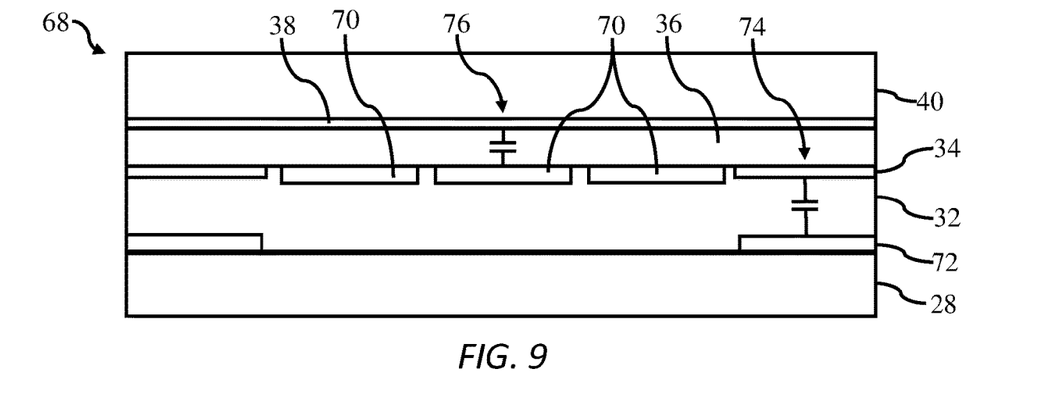
FIG. 9. illustrates a section elevation view of a first alternative implementation touch-bend sensing panel.

Referring to FIG. 9, a section elevation view of a first alternative implementation touch-bend sensing panel 68 is shown. In this implementation, the touch-bend sensing panel 68 includes two different sets of transmit electrodes. Like the touch-bend sensing panel 10 of FIGS. 2-3, the touch-bend sensing panel 68 includes a bottom substrate layer 28, an elastomeric layer 32, an insulator layer 36, and a top substrate layer 40. Unlike the touch-bend sensing panel 10 of FIGS. 2-3, this implementation has special transmit electrodes 72 for bend sensing only, deposited on the bottom substrate layer 28, and only along edges of the touch-bend sensing panel 68. The elastomeric layer 32 is deposited over the special transmit electrodes 72 and the bottom substrate layer 28.

Second electrodes 34 are deposited on the elastomeric layer 32, only along edges of the touch-bend sensing panel 68, and an array of conventional transmit electrodes 70 are deposited on the elastomeric layer 32 between the second electrodes 34. In the illustrated implementation, the conventional transmit electrodes 70 are oriented vertically in parallel, and the array of conventional transmit electrodes 70 extends horizontally across the touch-bend sensing panel 68 without covering the special transmit electrodes 72, which are also oriented vertically along the sides of the touch-bend sensing panel 68. Thus, the second electrodes 34 and the conventional transmit electrodes 70 are deposited on the elastomeric layer 32 in substantially the same horizontal plane between the elastomeric layer 32 and the insulator layer 36. The third electrodes 38 for touch sensing are disposed between the insulator layer 36 and the top substrate layer 36. The third electrodes 38 are arranged horizontally in parallel, and the array of third electrodes 38 extends vertically across the touch-bend sensing panel 68.

Thus, in the touch-bend sensing panel 68, the second electrodes 34 sense a change in a bend sensing capacitance 74 between the special transmit electrodes 72 and the second electrodes 34 caused by a change in the distance between them through the elastomeric layer 32, when the elastomeric layer is compressed by creasing effects from bending the touch-bend sensing panel 68. In contrast, the third electrodes 38 sense a change in touch sensing capacitance 76 between the conventional transmit electrodes 70 and the third electrodes 38 across the insulator layer 36, inward of the edges of the touch-bend sensing panel 68. By limiting the second electrodes 34 and the special transmit electrodes 72 to the edges of the touch-bend sensing panel 68, clearer separation of the two modalities are achieved, along with a possible reduction in costs. This also provides more freedom to arrange the conventional transmit electrodes 70 and third electrodes 38 in different ways to provide better sensitivity for the two kinds of sensing (i.e., bending and touch) and/or may provide better rejection of crosstalk between the two modalities (i.e., preventing a finger touch from giving an erroneous bend reading and vice versa).

Figure 10:
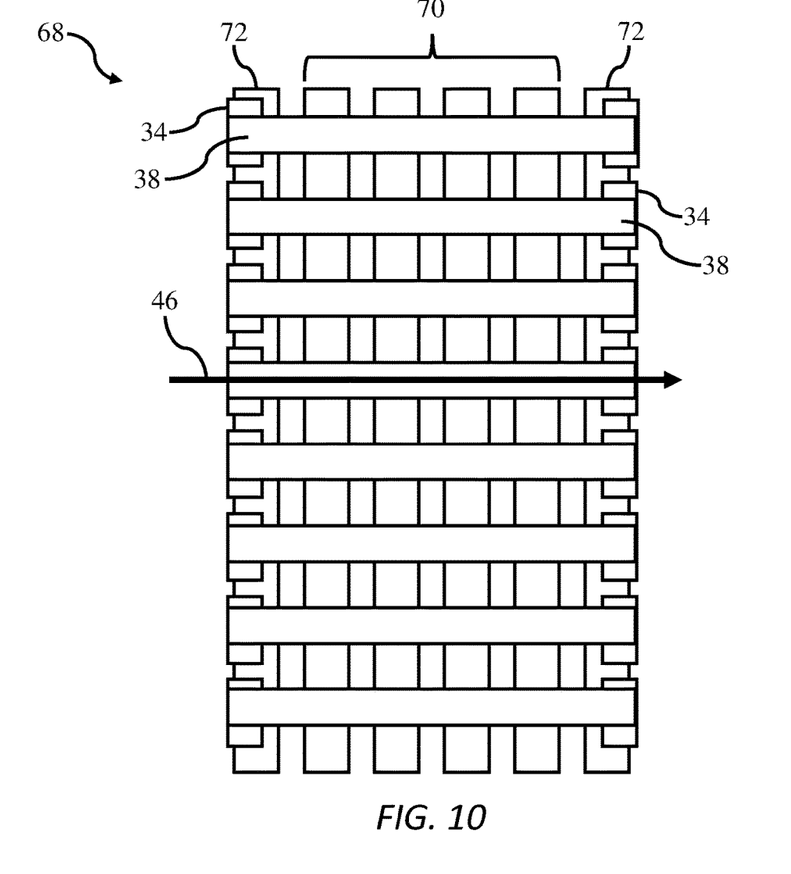
FIG. 10 illustrates a plan view of an arrangement of the electrodes in the first alternative implementation touch-bend sensing panel.

FIG. 10 illustrates, in plan the arrangement of the electrodes in the first alternative implementation touch-bend sensing panel 68. The conventional transmit electrodes 70 are shown in a vertical orientation extending horizontally across the touch-bend sensing panel 68, except at the edges, where the special transmit electrodes 72 for bend sensing. The second electrodes 34 are disposed along the edges of the touch-bend sensing panel 68 for sensing bending of the touch-bend sensing panel 68. The third electrodes 38 are horizontally oriented, and extend vertically across the touch-bend sensing panel 68, thus allowing touch screen functionality in the touch-bend sensing panel 68. The bending axis 46 is also shown in this view. When the touch-bend sensing panel 68 is bent along the bending axis 46, creasing effects cause a reduction in thickness in the elastomeric layer 32 (FIG. 9) adjacent the bending axis 46, and a change in capacitance bet ween the second electrodes 34 and the special transmit electrodes 72 identify the location of the bending axis 46 for converting to a folded configuration 14 (as shown in FIGS. 1 and 3).

Figure 11:
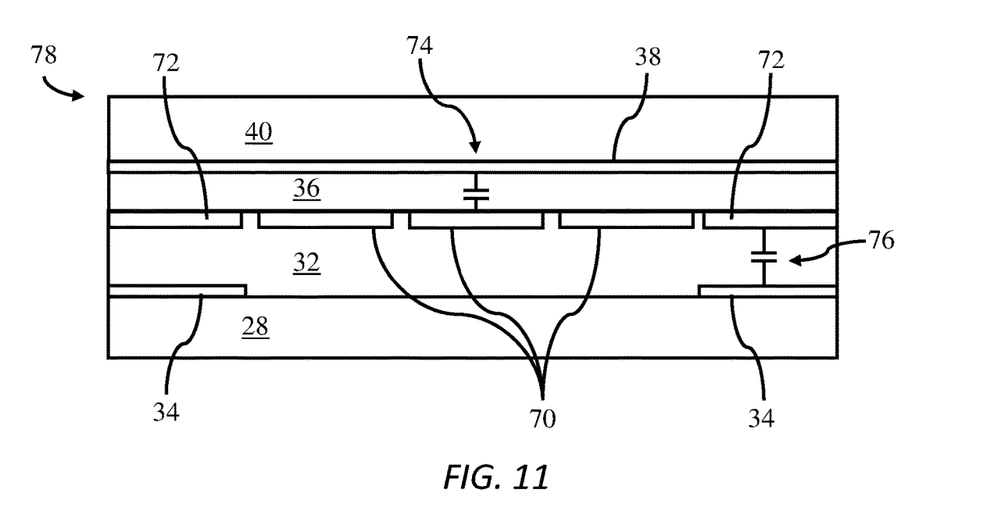
FIG. 11 illustrates a section elevation view of a second alternative implementation touch-bend sensing panel.

Referring to FIG. 11, a section elevation view of a second alternative implementation touch-bend sensing panel 78 is shown. The second alternative implementation touch-bend sensing panel 78 is similar to the first alternative implementation touch-bend sensing panel 68 (FIGS. 9 and 10) in that it includes a bottom substrate layer 28, an elastomeric layer 32 deposited on the bottom substrate layer 28, an insulator layer 36 deposited on the elastomeric layer 32, and a top substrate layer 36 deposited on the insulator layer 36, with conventional transmit electrodes 70 deposited between the elastomeric layer 32 and the insulator layer 36, and third electrodes 38 deposited between the insulator layer 36 and the top substrate layer 40.

The second alternative implementation touch-bend sensing panel 78 differs from the first alternative implementation touch-bend sensing panel 68 in that the bend sensing second electrodes 34 are disposed on edges of the touch-bend sensing panel 78 between the bottom substrate layer 28 and the elastomeric layer 32, and the conventional transmit electrodes 70 are disposed between the elastomeric layer 32 and the insulator layer 36. Thus both the conventional transmit electrodes 70 and the special transmit electrodes 72 are deposited in the same plane.

The second alternative implementation touch-bend sensing panel 78 is similar to the first alternative implementation touch-bend sensing panel 68, in that a change in thickness of the elastomeric layer 32 causes a change in distance between the second electrodes 34 and the special transmit electrodes 72 along the sides of the touch-bend sensing panel 78 causes a change in a bend sensing capacitance 74 for detecting bending of the touch-bend sensing panel 78, and a touch sensing capacitance 76 is detected across the insulator layer 36 between the conventional transmit electrodes 70 and the third electrodes 38. The primary difference between the first alternative implementation touch-bend sensing panel 68 and the second alternative implementation touch-bend sensing panel 78 is the relative positions of the second electrodes 34 and the special transmit electrodes 72 for bend sensing are reversed.

Figure 12:
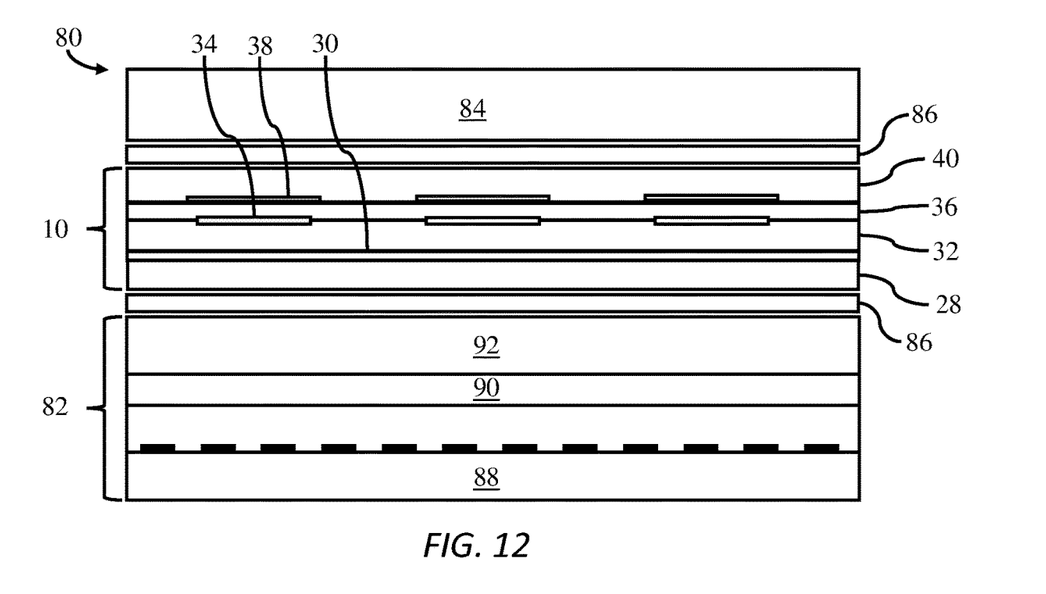
FIG. 12 illustrates a section elevation a display with the touch-bend sensing panel in an out-cell configuration.

FIG. 12 illustrates a section elevation view of a touch-bend sensing OLED display 80 comprising a touch-bend sensing panel 10 and an OLED 82 in an out-cell configuration. The touch-bend sensing panel 10 includes the layers shown in FIGS. 2, 3, 9, and 11, including a bottom substrate layer 28, an array of first electrodes 30 deposited on the bottom substrate layer 28, an elastomeric layer 32 deposited on the first electrodes 30, an array of second electrodes 34 deposited on the elastomeric layer 32 orthogonal or perpendicular to the array of first electrodes 30, an insulator layer 34 deposited over the second electrodes 34 and elastomeric layer 32, an array of third electrodes 38 deposited on the insulator layer parallel to and covering the second electrodes 34, and a top substrate layer 40 deposited on the third electrodes 38 and insulator layer 36.

The OLED 82 includes a thin film transistor backplane layer 88, a cathode layer 90, and thin film encapsulation layer 92, among other customary OLED layers, and is placed under the touch-bend sensing panel 10 and adhered thereto with an adhesive layer 86 laminating the touch-bend sensing panel 10 to the thin film encapsulation layer 92 of the OLED 82. A polarizer 84 is placed over the top substrate layer 40, and affixed thereto with an adhesive layer 86 between the polarizer 84 and top substrate layer 40.

Figure 13:
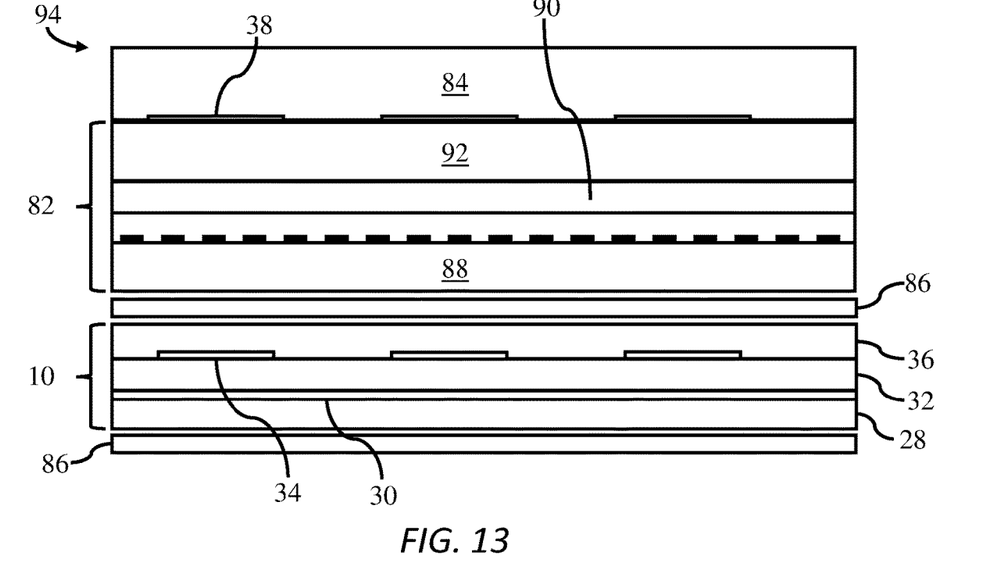
FIG. 13 illustrates a section elevation view of a display with the touch-bend sensing panel in an 'under-OLED' configuration.

FIG. 13 illustrates a section elevation view of a touch-bend sensing OLED display 94 comprising the touch-bend sensing panel 10 under the OLED 82 (i.e., in an 'under-OLED' configuration). The touch-bend sensing panel 10 in this implementation includes a bottom substrate layer 28, an array of first electrodes 30, an elastomeric layer 32, an array of second electrodes 34 deposited on the elastomeric layer 32 orthogonal or perpendicular to the array of first electrodes 30, an insulator layer 34, and an insulator layer 34 deposited over the second electrodes 34 and the elastomeric layer 32, but lacks the top substrate layer 40 shown in FIGS. 2, 3, 9, 11, and 12.

The OLED 82 includes a thin film transistor backplane layer 88, a cathode layer 90 and a thin film encapsulation layer 92 among other customary OLED layers. The thin film transistor backplane layer 88 is laminated directly to the insulator layer 36 with an adhesive layer 86. The array of third electrodes 38 for touch sensing, are deposited directly on the thin film encapsulation layer 92 of the OLED 82, and a polarizer 84 is laminated over the third electrodes 38 and the thin film encapsulation layer 92.

Figure 14:
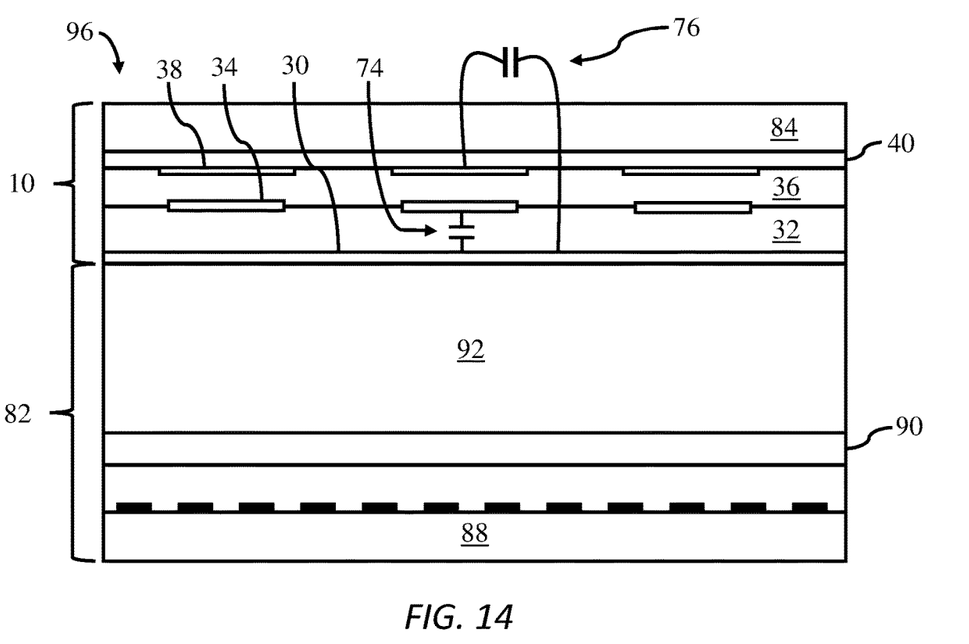
FIG. 14 illustrates a section elevation view of a display with the touch-bend sensing panel in an on-cell configuration.

FIG. 14 illustrates a section elevation view of a foldable touch-bend sensing OLED display 96 comprising an OLED 82 and the touch-bend sensing panel 10 in an on-cell configuration. In this implementation, the touch-bend sensing panel 10 comprises an array of first electrodes 30, an elastomeric layer 32, the array of second electrodes 34, an insulator layer 36, an array of third electrodes 38, and a top substrate layer 40, but lacks any bottom substrate layer 28 (as shown in FIGS. 2, 3, 9, 11, 12, and 13). The OLED 82 includes a thin film transistor backplane layer 88, cathode layer 90, and thin film encapsulation layer 92, among other customary OLED layers.

With no bottom substrate layer 28, the array of first electrodes 30 of the touch-bend sensing panel 10 is laminated directly to the thin film encapsulation layer 92 of the OLED 82, which serves as a bottom substrate for the touch-bend sensing panel 10. An elastomeric layer 34 is deposited over the first electrodes 30, and an array of second electrodes 34 have been deposited over the elastomeric layer 32 orthogonal or perpendicular to the array of first electrodes 30, with a bend sensing capacitance 74 between them. An insulator layer 36 has been placed over the second electrodes 34 and the elastomeric layer 32. An array of third electrodes 38 have been deposited over the insulator layer. The third electrodes 38 are preferably in parallel with and cover the second electrodes 34, and have a touch sensing capacitance 76 between the third electrodes 38 and the first electrodes 30. A top substrate layer 40 has been deposited over the third electrodes 38 and insulator layer 36, and a polarizer is laminated over the top substrate layer 40.

Figure 15:
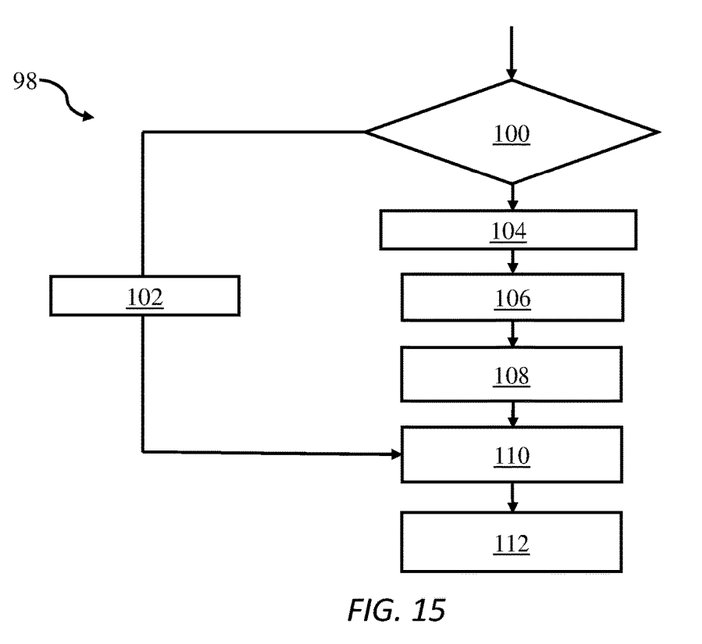
FIG. 15 illustrates a flowchart of an algorithm for detecting bending and touch in the touch-bend sensing panel.

FIG. 15 illustrates a flowchart 98 of an algorithm for operating the touch-bend sensing panel 10 and display-integrated shape sensing to detect bending in the touch-bend sensing panel 10. In action 100 the algorithm determines whether or not the touch-bend sensing panel 10 is folded. This determination may be made using the circuitry illustrated in FIGS. 6-8. If the touch-bend sensing panel 10 is not folded the algorithm proceeds to action 102, setting the touch sensing function for a first interface, i.e., the flat panel tablet touch interface, and proceeds to action 110 for detecting touch by a user engaging the touch-bend sensing panel 10 in the flattened configuration 12, and proceeding to action 112 for generating a human interface device HID report for sending an interpreting data.

If, in action 100, the algorithm determines the touch-bend sensing panel 10 is folded, it proceeds to action 104, and sets the touch-bend sensing panel 10 touch sensing function for a second interface according to the folded configuration 14. The algorithm then proceeds to action 106 for determining the folding angle, and then proceeds to action 108 for allocating appropriate functions in various locations on the touch-bend sensing panel 10 (for example, setting a display portion 16, and an input portion 18 as shown in FIG. 1). Once appropriate functions have been allocated, the algorithm proceeds to action 110 for detecting touch by a user engaging the touch-bend sensing panel 10 in the folded configuration 14, and the algorithm produces to 12 for generating the HID report.

In one implementation, in the fold detection action 100 may be configured to determine whether the touch-bend sensing panel 10 is open or completely folded closed, similar to a laptop computer, or partially folded. In another implementation folding angle detection action 106 may be configured to allocate different functions at multiple different fold angles. In yet another implementation, the function allocation action 108 may cause some areas of the touch-bend sensing panel 10 to have both display and touch functionality, while other areas of the touch-bend sensing panel 10 have only display functionality.

Figure 16:
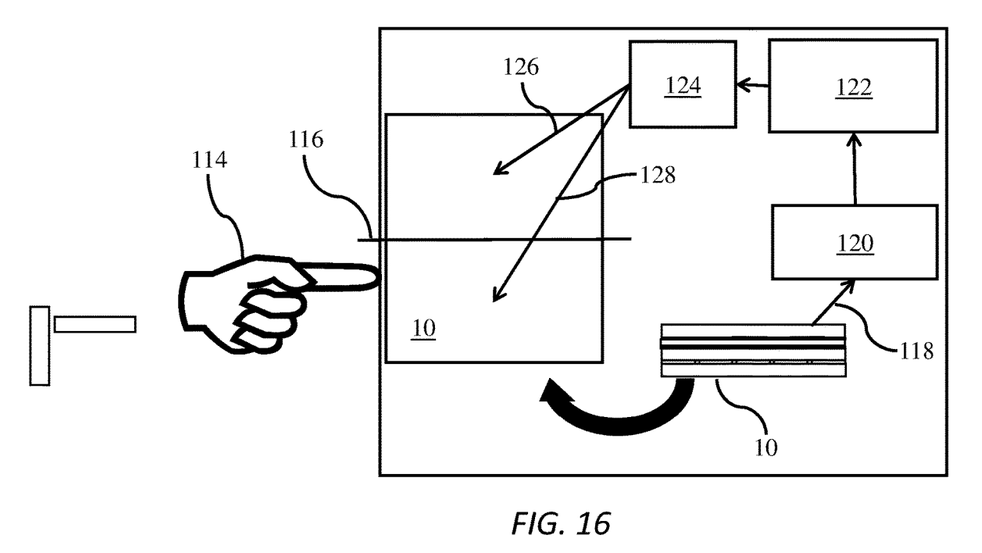
FIG. 16 illustrates a system diagram of the touch-bend sensing panel.

FIG. 16 illustrates a system diagram of a device incorporating the touch-bend sensing panel 10. A user provides touch input 114 on the touch-bend sensing panel 10 and/or may fold the touch-bend sensing panel 10 along a bend axis 116. When a folding (i.e., bending) action occurs, the touch-bend sensing panel 10 sends touch and/or bend raw signals 118 to a touch/bend controller 120, which converts the raw signal to digital information. The digital information is provided to a processing unit (e.g., a processor) 122. Using application/operating system/storage information 124, the processing unit 122 controls output on the touch-bend sensing panel 10. In the illustrated implementation, when the touch-bend sensing panel 10 is folded along the bend axis 116, the processing unit 122 causes the touch-bend sensing panel 10 to display a first graphical output 126 above the bend axis 116 (such as, for example, the display portion 16 of FIG. 1), and a second graphical output 128 below the bend axis 116 (for example, the input portion 18 of FIG. 1).

The structure and function of the touch-bend sensing panel 10 having been shown and described, an exemplary method of fabrication will now be discussed.

In order to fabricate the touch-bend sensing panel 10, in a primary implementation as shown in FIG. 1, a bottom substrate layer 28 is formed. Thereafter, an array of first electrodes 30 are formed on the bottom substrate layer 28. Preferably the first electrodes 30 extend in a first direction, in parallel, across the bottom substrate layer 28 as is customary with touch screen displays. An elastomeric layer 32 is then deposited over the first electrodes 30 and the bottom substrate layer 28. As discussed, the elastomeric layer 32 preferably has a low modulus of elasticity, preferably below 1 MPa. An array of second electrodes 34 are then formed over the elastomeric layer 32. The second electrodes 34 are preferably arranged orthogonally or perpendicular to the first electrodes 30 such that a first capacitance 42 between the second electrodes 34 and first electrodes 30 may be detected at any point across the touch-bend sensing panel 10.

An insulator layer 36 is formed over the second electrodes 34 and the elastomeric layer 32, and an array of third electrodes 38 are formed over the insulator layer 36. The third electrodes 38 are also arranged orthogonally or perpendicular to the first electrodes 30, and preferably cover the second electrodes 34, such that a second capacitance 44 between the third electrodes 38 and the first electrodes 30 may be detected at any point across the touch-bend sensing panel 10 while shielding the second electrodes 34 from unwanted touch capacitance effects. Thereafter a top substrate layer 40 is deposited over the third electrodes 38 and the insulator layer 36.

In order to fabricate a first alternative implementation touch-bend sensing panel 68, as shown in FIG. 9, the bottom substrate layer 28 is formed. Thereafter a series of special transmit electrodes 72 are formed over the bottom substrate layer 28 along the edges of the touch-bend sensing panel 68. An elastomeric layer 32 is then formed over the special transmit electrodes 72 and the bottom substrate layer 28. Second electrodes 34 are then deposited on the elastomeric layer 32 over the special transmit electrodes 72 along the edges of the touch-bend sensing panel 68, and an array of conventional transmit electrodes 70 are deposited across the elastomeric layer 32 between the second electrodes 34. Preferably, the special transmit electrodes 72 and the conventional transmit electrodes 70 are arranged across the touch-bend sensing panel 68 in parallel in a first direction, and the second electrodes 34 are parallel to, and at least partially cover the special transmit electrodes 72 so they have a first capacitance 42 between them.

An insulator layer 34 is deposited over the second electrodes 34, conventional transmit electrodes 70, and the elastomeric layer 32. A series of third electrodes 38 are then formed over the insulator layer 36. The third electrodes 38 are preferably arranged in a second direction orthogonal or perpendicular to the conventional transmit electrodes 70, such that a touch sensing capacitance 76 between the third electrodes 38 and the conventional transmit electrodes 70 may be detected at any point across the touch-bend sensing panel 68. In contrast, the second electrodes 34 and special transmit electrodes 72 are arranged only on opposing sides of the touch-bend sensing panel 68, thus allowing bend detection along an axis parallel to the second direction at any position on the touch-bend sensing panel 68.

In order to fabricate a second alternative implementation touch-bend sensing panel 78, in a second alternative implementation as shown in FIG. 11, the bottom substrate layer 28 is formed, and a series of second electrodes 34 are formed over the bottom substrate layer 28 along the edges of the touch-bend sensing panel 10. An elastomeric layer 32 is then deposited over the second electrodes 34 and the bottom substrate layer 28. Thereafter, special transmit electrodes 72 are formed on the elastomeric layer 32 along the edges of the touch-bend sensing panel 78 over the second electrodes 34, and conventional transmit electrodes 70 are formed across the elastomeric layer 32 between the special transmit electrodes 72. Preferably, the special transmit electrodes 72 and the conventional transmit electrodes 70 are arranged across the touch-bend sensing panel 78 in parallel in a first direction, and the special transmit electrodes 72 are parallel to, and at least partially cover the second electrodes 34 so they have a first capacitance 42 between them.

An insulator layer 34 is deposited over the second electrodes 34, conventional transmit electrodes 70, and the elastomeric layer 32. A series of third electrodes 38 are then formed over the insulator layer 36. The third electrodes 38 are preferably arranged in a second direction orthogonal or perpendicular to the conventional transmit electrodes 70, such that a touch sensing capacitance 76 between the third electrodes 38 and the conventional transmit electrodes 70 may be detected at any point across the touch-bend sensing panel 78. In contrast, the second electrodes 34 and special transmit electrodes 72 are arranged only on opposing sides of the touch-bend sensing panel 68, thus allowing bend detection along an axis parallel to the second direction at any position on the touch-bend sensing panel 68.

In an implementation in which a display 80 is formed combining an OLED 82 and the touch-bend sensing panel 10 in an out-cell configuration as shown in FIG. 12, the touch-bend sensing panel 10 is formed according to one of the previously discussed implementations. The touch-bend sensing panel 10 is then laminated onto a thin film encapsulation layer 92 of the OLED 82 with an adhesive layer 86. A polarizer 84 is then laminated onto the touch-bend sensing panel 10, also with the adhesive layer 86, such that the touch-bend sensing panel 10 is disposed between the OLED 82 and the polarizer 84.

In another implementation in which a display 94 is formed combining an OLED 82 and the touch-bend sensing panel 10 in an 'under-OLED' configuration as shown in FIG. 13, the touch-bend sensing panel 10 is formed with a bottom substrate layer 28. An array of first electrodes 30 is formed over the bottom substrate layer 28, and an elastomeric layer 32 is deposited over the first electrodes 30. An array of second electrodes 34 are then formed over e elastomeric layer 32. The second electrodes 34 are preferably arranged orthogonally or perpendicular to the first electrodes 30. An insulator layer 36 is deposited over the second electrodes 34 and the elastomeric layer 32.

The OLED 82 includes a thin film transistor backplane layer 88 and a thin film encapsulation layer 92, among other customary OLED layers. The thin film transistor backplane layer 88 is laminated to the touch-bend sensing panel 10 with an adhesive layer 86. An array of third electrodes 38 are formed over the thin film encapsulation layer 92 of the OLED 82. The array of third electrodes 38 are also arranged orthogonally or perpendicular to the first electrodes 30, and preferably cover and shield the second electrodes 34. A polarizer 84 is laminated over the array of third electrodes 38 and the thin film encapsulation layer 92 of the OLED 82.

In yet another implementation, in which a display 96 is formed combining an OLED 82 and the touch-bend sensing panel 10 in an on-cell configuration as shown in FIG. 14, the touch-bend sensing panel 10 is formed with an array of first electrodes 30 formed directly on a thin film encapsulation layer 92 of the OLED 82. An elastomeric layer 32 is deposited on the first electrodes 30, and an array of second electrodes 34 are formed on the elastomeric layer 32. The second electrodes 34 are preferably arranged orthogonally or in planar perpendicular to the first electrodes 30. An insulator layer 36 is deposited over the second electrodes 34 and the elastomeric layer 32.

An array of third electrodes 38 are formed on the insulator layer 36. The third electrodes 38 are also preferably arranged orthogonally or in planar perpendicular to the first electrodes 30, in order to cover and shield the second electrodes 34 from capacitive touch forces. A top substrate layer 40 is deposited over the array of third electrodes 38 and the insulator layer 36, and a polarizer 84 is then laminated over the top substrate layer 40.

From the above description, it is manifested that various techniques may be used for implementing the concepts described in the present disclosure without departing from the scope of those concepts. Moreover, while the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described above, but many rearrangements, modifications, and substitutions are possible without departing from the scope of the present disclosure.

What is claimed is:

1. A flexible touch panel apparatus, comprising:
   a plurality of first electrodes extending along a first direction;
   at least one second electrode extending along a second direction, the at least one second electrode defining a bending axis of the flexible touch panel apparatus;
   an elastomeric layer disposed between the plurality of first electrodes and the at least one second electrode;
   a plurality of third electrodes extending along the second direction parallel to the bending axis; and
   an insulator layer disposed between the at least one second electrode and the plurality of third electrodes;
   wherein the at least one second electrode is capacitively coupled to at least one of the plurality of first electrodes for bend sensing in the flexible touch panel apparatus along the bending axis,
   wherein the plurality of third electrodes are capacitively coupled to the plurality of first electrodes for touch sensing on the flexible touch panel apparatus, and
   wherein at least one of the plurality of third electrodes overlaps the at least one second electrode in a third direction, thereby shielding the at least one second electrode from interference by user capacitive touch effects so as to cover a whole part of the at least one second electrode in the first direction, the third direction being perpendicular to the first direction and the second direction.

2. The apparatus of claim 1, wherein the at least one second electrode is capacitively coupled to at least one of the plurality of first electrodes for force sensing on the flexible touch panel apparatus.

3. The apparatus of claim 1, wherein a bend along the bending axis results in a change in a thickness of the elastomeric layer between the at least one second electrode and at least one of the plurality of first electrodes, thereby changing a capacitance between the at least one second electrode and the at least one of the plurality of first electrodes.

4. The apparatus of claim 1, wherein the elastomeric layer has a modulus of elasticity below 1 MPa.

5. The apparatus of claim 1, wherein the insulator layer has a modulus of elasticity greater than that of the elastomeric layer.

6. The apparatus of claim 1, wherein the first direction is perpendicular to the second direction.

7. The apparatus of claim 1, wherein the plurality of third electrodes includes projected capacitance touch sensing electrodes.

8. The apparatus of claim 1, wherein the plurality of first electrodes are configured to transmit at least one sensing signal.

9. The apparatus of claim 1, wherein the at least one second electrode is configured to receive one or more sensing signals.

10. The apparatus of claim 1, wherein the plurality of third electrodes is configured to receive one or more sensing signals.

11. The apparatus of claim 1, wherein the at least one second electrode is disposed proximal an edge of the flexible touch panel apparatus.

12. The apparatus of claim 1, wherein the plurality of first electrodes comprises a transmit electrode for touch, and a special transmit electrode for bend sensing.

13. The apparatus of claim 12, wherein the transmit electrode for touch, and the special transmit electrode for bend sensing are disposed in a common layer of the flexible touch panel apparatus.

14. The apparatus of claim 1, wherein the plurality of first electrodes, the at least one second electrode, and the plurality of third electrodes are disposed between a polarizer and an OLED display.

15. The apparatus of claim 14, wherein the OLED display comprises a thin film encapsulation layer.

16. The apparatus of claim 1, wherein an OLED display is disposed between the plurality of third electrodes and the plurality of first electrodes.

17. The apparatus of claim 16, wherein the OLED display is disposed between the plurality of third electrodes and the at least one second electrode.

18. The apparatus of claim 16, further comprising a thin film encapsulation layer between the OLED display and the plurality of third electrodes.

19. The apparatus of claim 1, wherein the plurality of first electrodes comprise a transmitting layer deposited directly on an OLED display thin film encapsulating layer.

* * * * *